US012225715B2

(12) United States Patent
Tung et al.

(10) Patent No.: US 12,225,715 B2
(45) Date of Patent: Feb. 11, 2025

(54) SEMICONDUCTOR DEVICE HAVING SEMICONDUCTOR LAYERS DISPOSED BETWEEN UPPER PORTIONS OF THE ISOLATION STRUCTURES AND THE ACTIVE REGIONS

(71) Applicant: Fujian Jinhua Integrated Circuit Co., Ltd., Quanzhou (CN)

(72) Inventors: Yu-Cheng Tung, Quanzhou (CN); Janbo Zhang, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 246 days.

(21) Appl. No.: 17/983,402

(22) Filed: Nov. 9, 2022

(65) Prior Publication Data

US 2024/0057315 A1    Feb. 15, 2024

(30) Foreign Application Priority Data

Aug. 12, 2022   (CN) .......................... 202210965553.5
Aug. 12, 2022   (CN) .......................... 202222119832.8

(51) Int. Cl.
*H10B 12/00*      (2023.01)

(52) U.S. Cl.
CPC ........... *H10B 12/34* (2023.02); *H10B 12/053* (2023.02); *H10B 12/482* (2023.02); *H10B 12/485* (2023.02)

(58) Field of Classification Search
CPC .... H10B 12/053; H10B 12/34; H10B 12/482; H10B 12/485; H01L 29/4236; H01L 29/7813; H01L 21/76229; H01L 21/76232
USPC ......................................................... 257/374
See application file for complete search history.

(56) References Cited

U.S. PATENT DOCUMENTS

2020/0411363 A1\* 12/2020 Lin ................. H01L 21/823892

\* cited by examiner

*Primary Examiner* — Hoai V Pham
(74) *Attorney, Agent, or Firm* — Winston Hsu

(57) ABSTRACT

A semiconductor device includes a substrate, a plurality of active regions disposed in the substrate and respectively extending along a first direction and arranged into an array, and a plurality of isolation structures disposed in the substrate between the active regions. The isolation structures respectively comprise an upper portion and a lower portion, wherein a sidewall of the upper portion comprises a first slope, a sidewall of the lower portion comprises a second slop, and the first slope and the second slope are different. The semiconductor device further includes a plurality of semiconductor layers disposed between the upper portions of the isolation structures and the active regions.

11 Claims, 10 Drawing Sheets

SEMICONDUCTOR DEVICE HAVING SEMICONDUCTOR LAYERS DISPOSED BETWEEN UPPER PORTIONS OF THE ISOLATION STRUCTURES AND THE ACTIVE REGIONS

BACKGROUND OF THE INVENTION

1. Field of the Invention

The present invention is related to a semiconductor device. More particularly, the present invention relates to a dynamic random access memory (DRAM) device and method for forming the same.

2. Description of the Prior Art

A dynamic random access memory (DRAM) device is a kind of volatile memory. A DRAM device usually includes an array region including a plurality of memory cells and a peripheral region including control circuits. Typically, a memory cell is composed of one transistor and one capacitor electrically coupled to the transistor, which is also known as a 1T1C cell. A digital data is stored in a memory cell by controlling the transistor to charge or discharge the capacitor. The control circuits in the peripheral region may address each of the memory cells in the array region to read, write or erase data by columns of word lines and rows of bit lines that respectively traverse through the array region and are electrically connected to each of the memory cells.

In advanced technology, three-dimensional (3D) DRAM structure including buried word lines and stacked capacitors are widely adopted to achieve higher array density. However, as the memory cells are arranged closer to each other, leakage and signal crosstalk between the memory cells have become a serious issue. How to ensure electrical isolation between the memory cells has become an important research project in this field.

SUMMARY OF THE INVENTION

One objective of the present invention is to provide a semiconductor device and a method for forming the same, which forms the isolation trenches between the active regions of the memory cells of the semiconductor device by a two-stage etching process, so that each isolation trench may has a two-stage sidewalls having different slops. This is beneficial for a better filling of the isolation trenches with a dielectric layer to provide an improved electrical isolation between the memory cells.

One embodiment of the present invention provides a semiconductor device includes a substrate, a plurality of active regions disposed in the substrate, respectively extending along a first direction and arranged into an array, a plurality of isolation structures disposed in the substrate between the active regions and respectively comprising an upper portion having a first thickness and a lower portion having a second thickness, wherein a sidewall of the upper portion comprises a first slope, a sidewall of the lower portion comprises a second slop, and the first slope and the second slope are different, and a plurality of semiconductor layers disposed between the upper portions of the isolation structures and the active regions.

Another embodiment of the present invention provides a method for forming a semiconductor device including the following steps. First, a substrate is provided. Next, a first etching process is performed to form a plurality of first trenches in the substrate to define a plurality of active regions in the substrate, wherein the active regions respectively extend along a first direction and arranged into an array, and a sidewall of each of the first trenches comprises a first slope. Following, a plurality of semiconductor layers are formed along the sidewalls and bottom surfaces of the first trenches. After that, through the first trenches and the semiconductor layers on the sidewalls of the first trenches, a second etching process is performed to etch the substrate to form a plurality of second trenches respectively directly under the first trenches, wherein a sidewall of each of the second trenches comprises a second slop, and the first slope and the second slope are different. Subsequently, a dielectric layer is formed to fill the first trenches and the second trenches.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. Other embodiments may be utilized and that structural, logical and electrical changes may be made without departing from the spirit and scope of the present invention.

Figure 1:
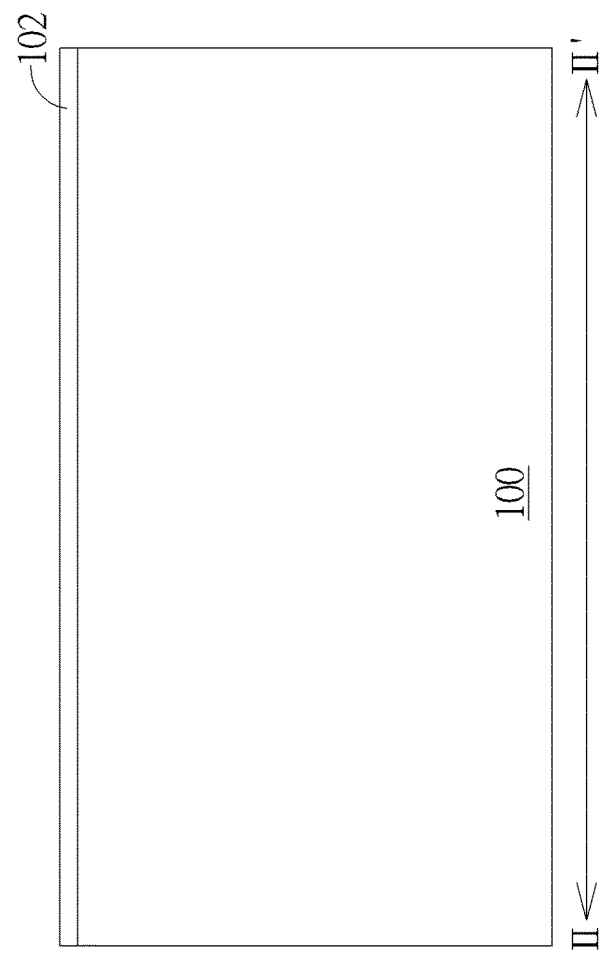
FIG. 1 to FIG. 8 are schematic diagrams illustrating the steps for manufacturing a semiconductor device according to an embodiment of the present invention.
Figure 2:
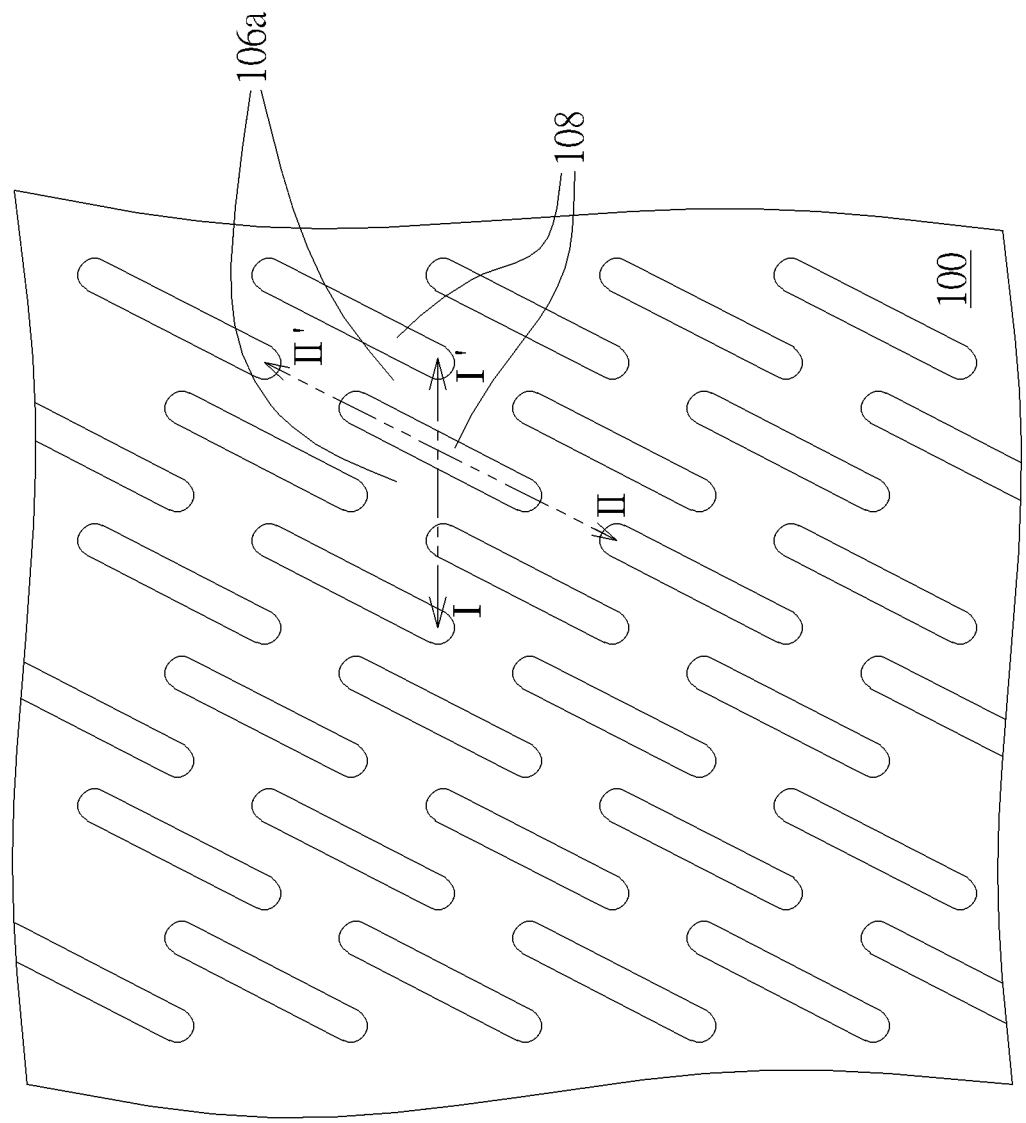
Figure 2:
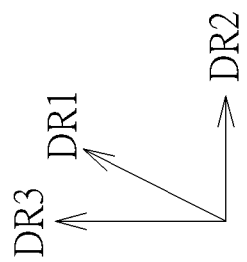
Figure 5:
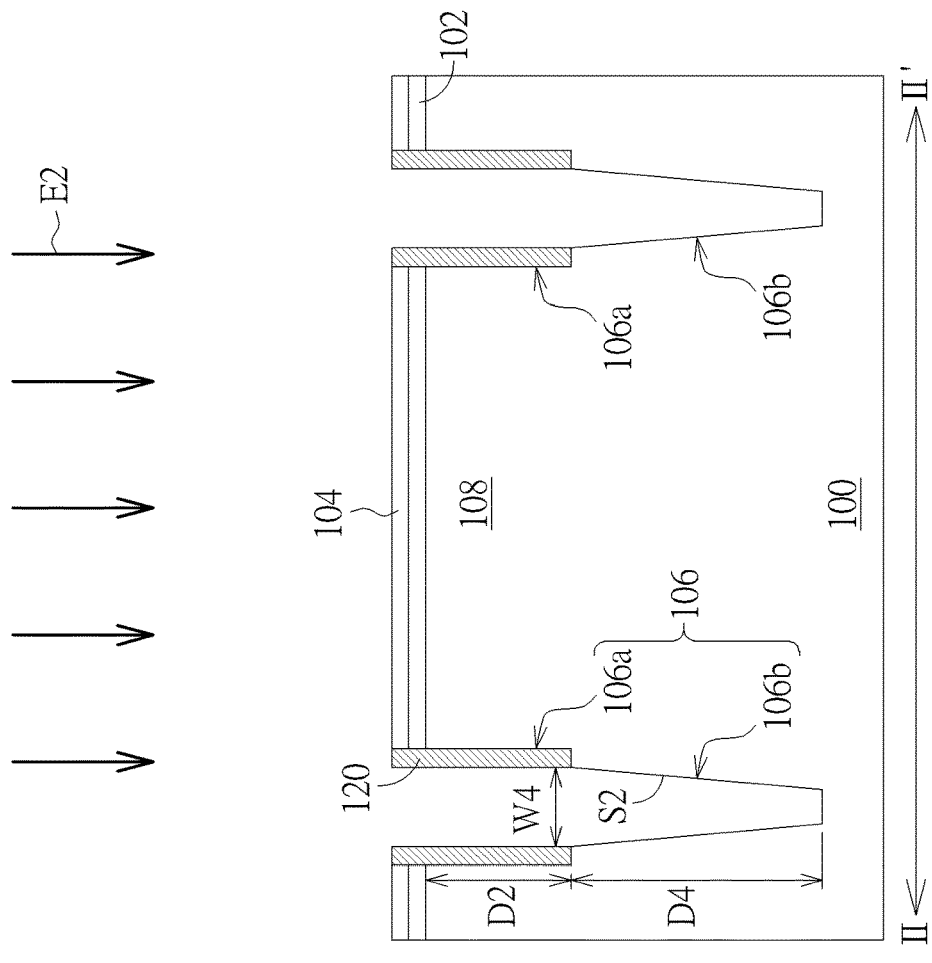
Figure 5:
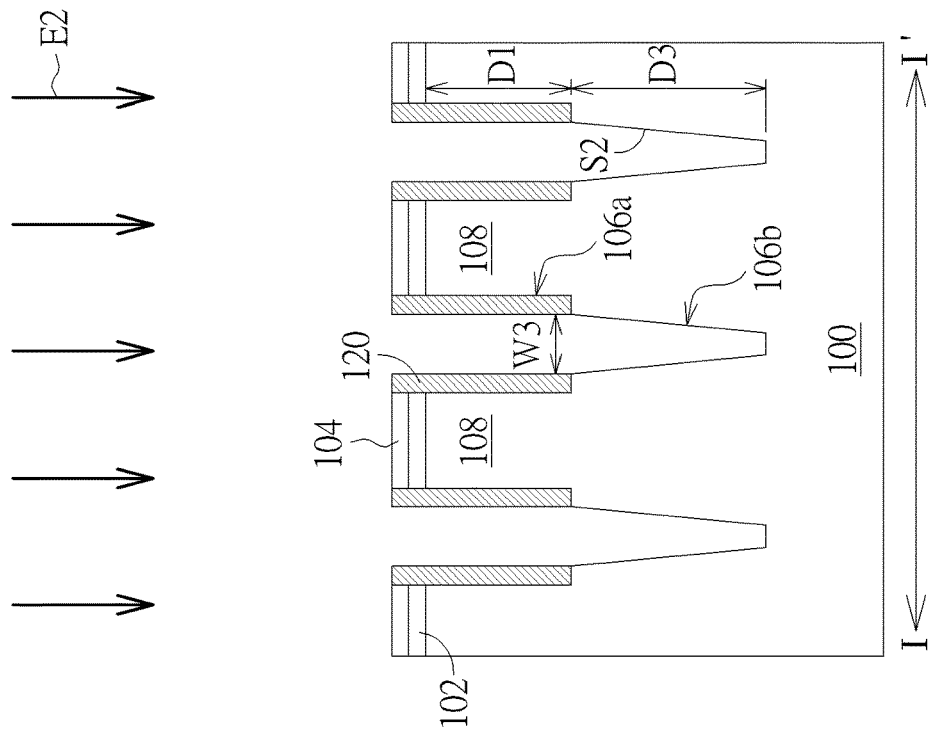
Figure 6:
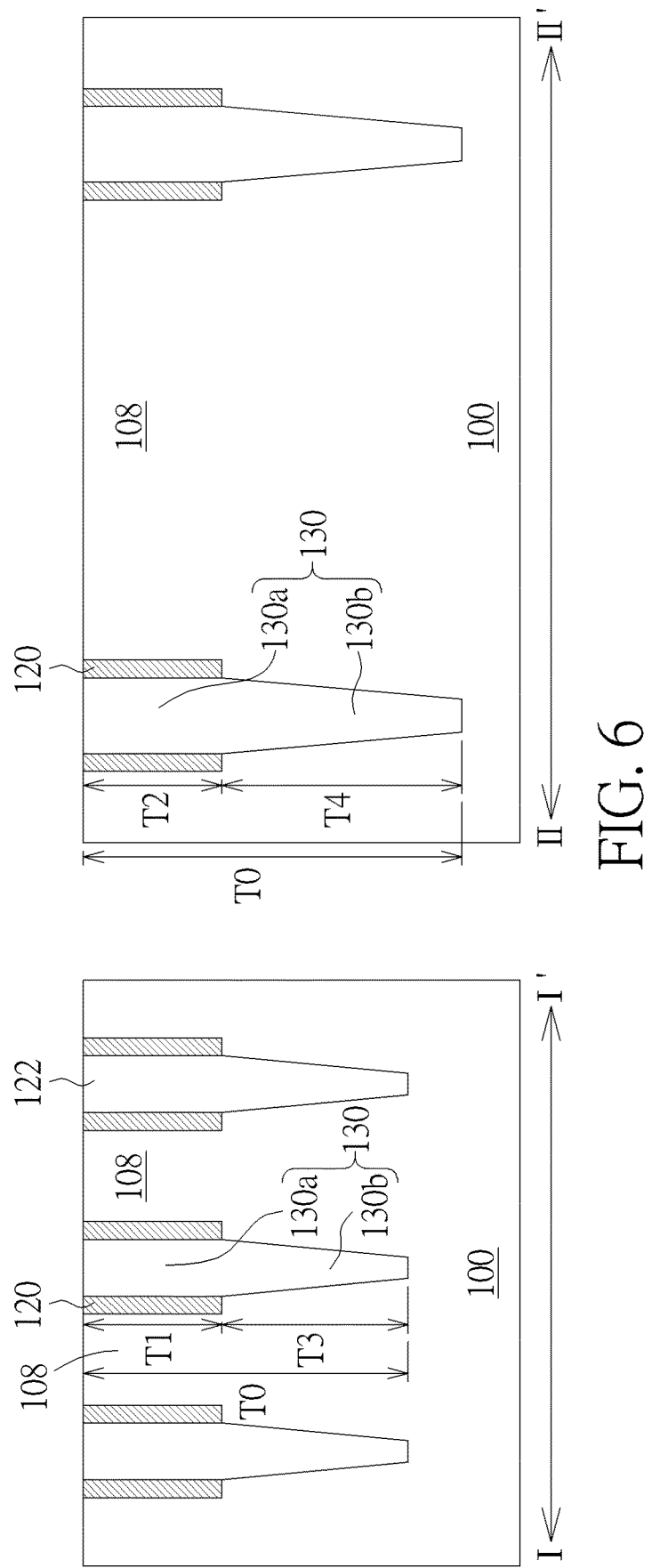
Figure 7:
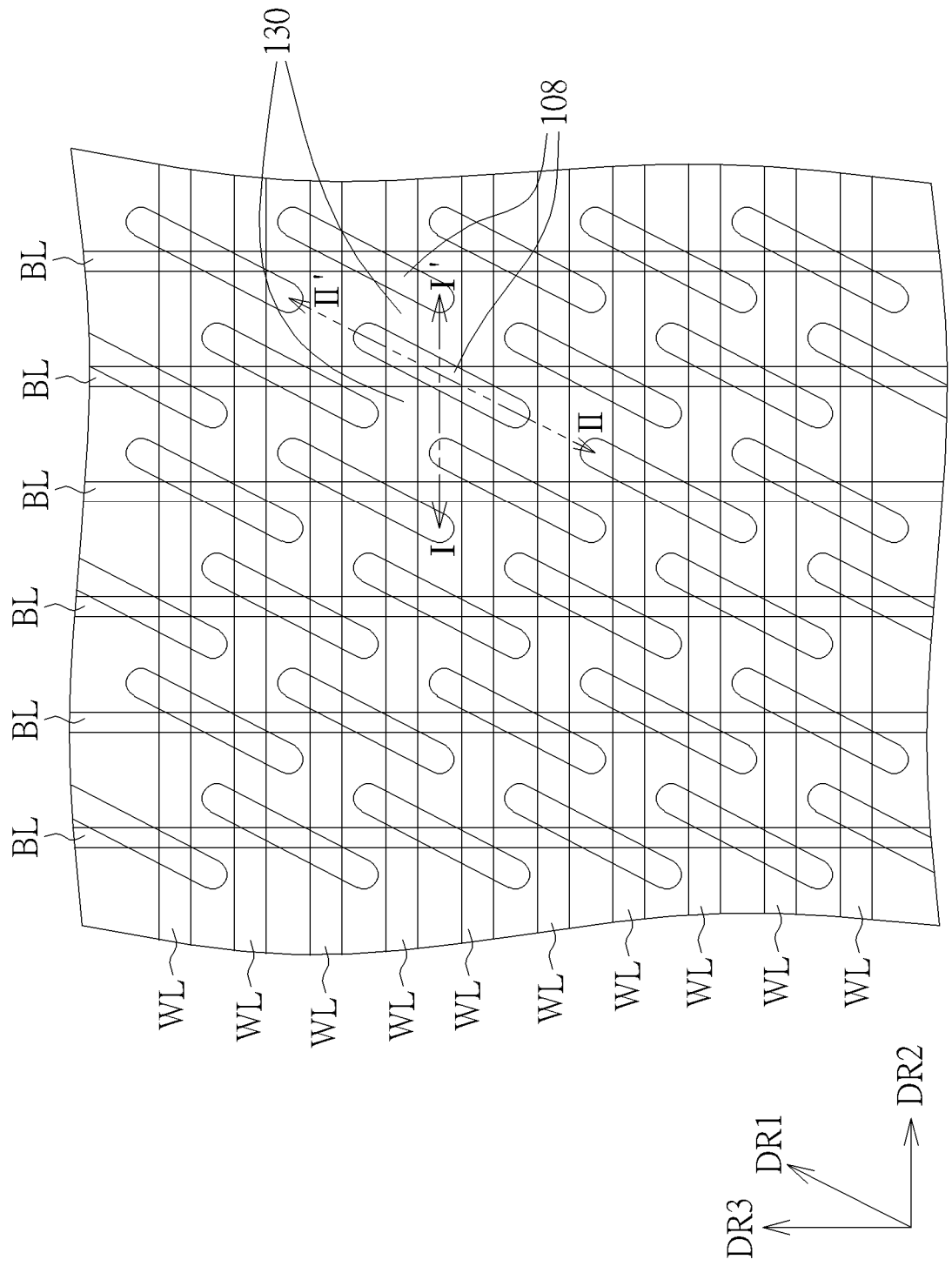

FIG. 1 to FIG. 8 are schematic diagrams illustrating the steps for manufacturing a semiconductor device according to an embodiment of the present invention. FIG. 2 and FIG. 7 are plan views of the semiconductor device. FIG. 1, FIG. 3 to FIG. 6, and FIG. 8 are cross-sectional views, wherein the left side of FIG. 1, FIG. 3 to FIG. 6, and FIG. 8 are taken along the line I-I' as shown in the plan views, and the right side of FIG. 1, FIG. 3 to FIG. 6, and FIG. 8 are taken along the line II-II' as shown in the plan views. The first direction DR1, second direction DR2, and third direction DR3 annotated in the diagrams are different directions along the surface of the substrate 100. The second direction DR2 and the third direction DR3 are perpendicular. The line I-I' cuts through the active regions 108 along the second direction DR2. The line II-II' cuts through the active regions 108 along the first direction DR1.

Please refer to FIG. 1. First, a substrate 100 is provided. The substrate 100 may be a silicon substrate, an epitaxial silicon substrate, a silicon germanium (SiGe) substrate, a silicon carbide (SiC) substrate, or a silicon-on-insulator (SOI) substrate, but is not limited thereto. The substrate 100 may be doped with dopants and have a specific conductivity type. According to an embodiment of the present invention, the substrate 100 may have P-type conductivity type. A pad layer 102 (such as a silicon oxide layer) may be formed on the surface of the substrate 100.

Figure 3:
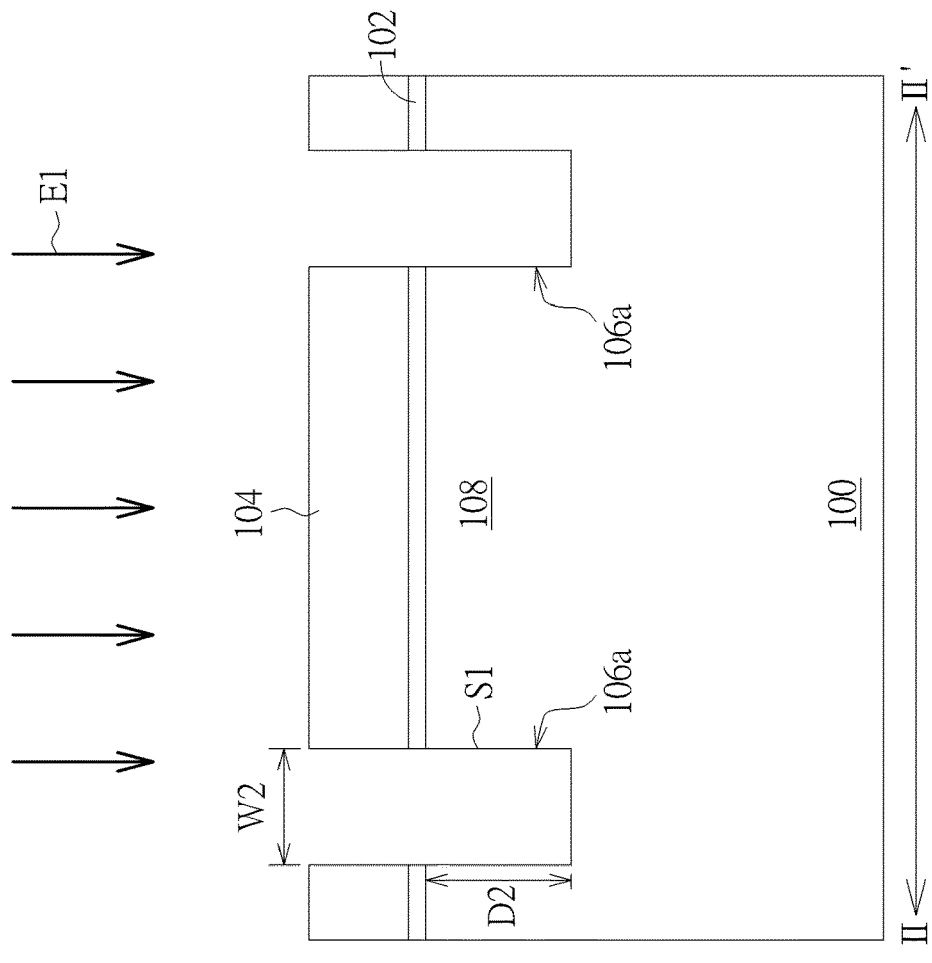
Figure 3:
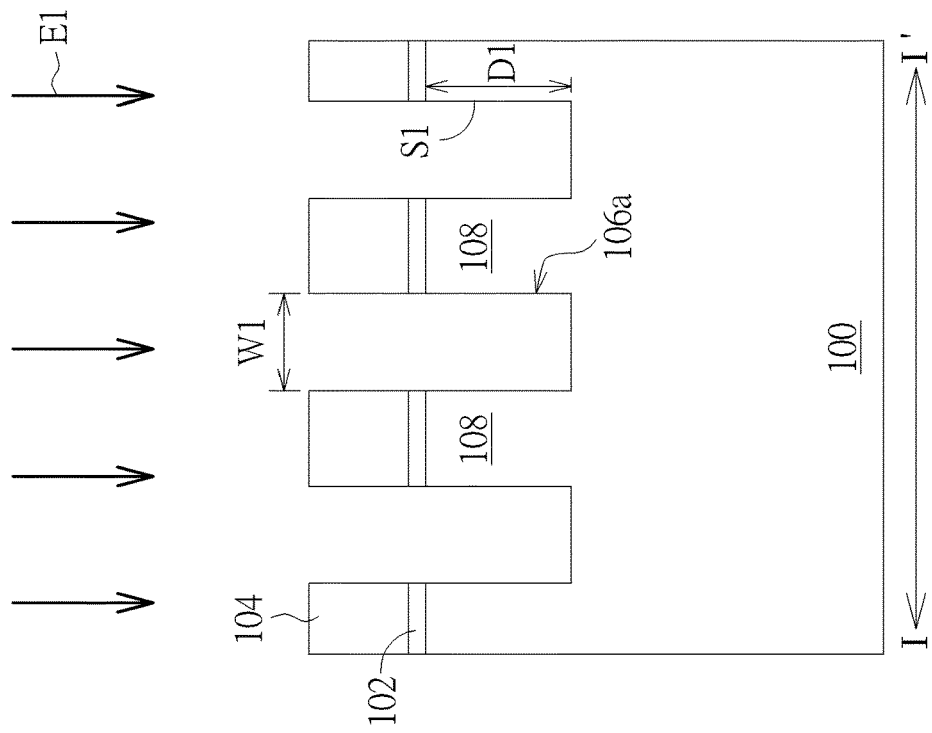

Please refer to FIG. 2 and FIG. 3. Subsequently, a hard mask layer 104 (such as a silicon nitride layer) is formed on the pad layer 102. A patterning process is then performed on the hard mask layer 104 to define the patterns of the active regions in the hard mask layer 104. After that, using the hard mask layer 104 as an etching mask, a first etching process E1 is performed to etch the substrate 100, thereby transferring the patterns of the active regions from the hard mask layer 104 to the substrate 100, forming a plurality of active regions 108 in the substrate 100 and a plurality of first trenches 106a spacing apart the active regions 108. After the first etching process E1, a clean step (such as solvent clean, plasma clean or any other suitable clean step) may be performed on the substrate 100 to remove by-products such as polymers formed during the first etching process E1.

According to some embodiments of the present invention, the first etching process E1 may be a reactive ion etching (ME) process using reactive gases such as oxygen-containing gases, fluorine-containing gases (such as $CF_4$, $SF_6$, $CH_2F_2$, $CHF_3$ and/or $C_2F_6$), chlorine-containing gases (such as $Cl_2$, $CHCl_3$, $CCl_4$ and/or $BCl_3$), bromine-containing gases (such as HBr and/or $CHBr_3$), iodine-containing gases, other suitable gases, or combinations thereof, but is not limited thereto. The first etching process E1 may use an inert gas such as argon (Ar) as a carrier gas or purge gas. According to an embodiment of the present invention, the first etching process E1 has a time mode etching end point which is determined according to the expected depths of the first trenches 106a.

As shown in FIG. 2, the active regions 108 respectively have an elongated shape, extending longitudinally along the first direction DR1 and are arranged parallel and staggered to each other to form an array. As shown in the left side of FIG. 3, the first trenches 106a between the side edges of the active regions 108 may respectively have a width W1 and a depth D1. As shown in the right side of FIG. 3, the first trench 106a between the terminal portions of the active regions 108 may respectively have a width W2 and a depth D2. In some embodiments of the present invention, the width W1 is smaller than the width W2, and the depth D1 is approximately equal to the depth D2. The cross-sectional profiles of the first trenches 106a may be controlled by adjusting the process parameters (such as gas ratio and power) of the first etching process E1. The first trenches 106a respectively have a sidewall S1 with a first slope, which may be represented as the angle defined by the sidewall S1 and the surface of the substrate 100. In some embodiments of the present invention, the first slope may be between approximately 80 and 90 degrees, but is not limited thereto. Preferably, the sidewalls S1 of the first trenches 106a are almost perpendicular to the surface of the substrate 100, so that the dimensions of the active regions 108 and the first trenches 106a may be better controlled to meet desired critical dimensions.

Figure 4:
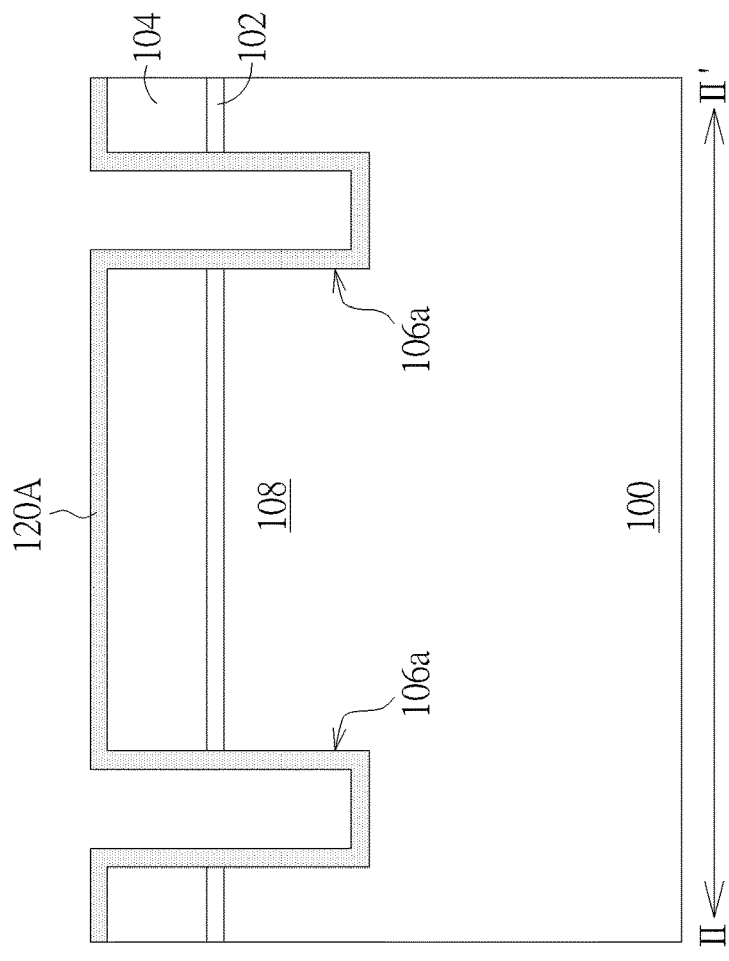
Figure 4:
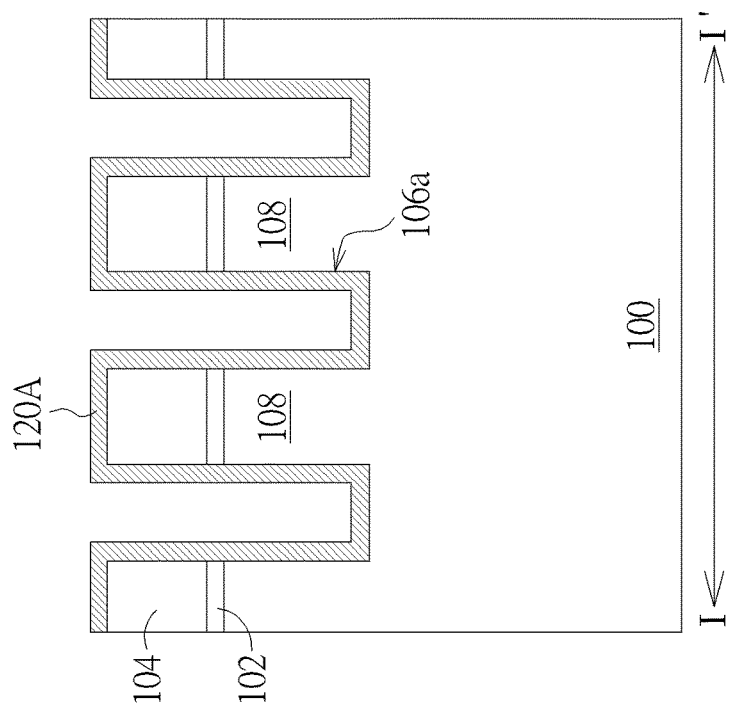

Please refer to FIG. 4. Subsequently, a deposition process such as chemical vapor deposition (CVD), physical vapor deposition (PVD), atomic layer deposition (ALD), or epitaxial growth deposition may be performed to form a conformal semiconductor material layer 120A along the hard mask layer 104 and the sidewalls and bottom surfaces of the first trenches 106a. In some embodiments, by selective deposition, the semiconductor material layer 120A may be formed only on the sidewalls and bottom surfaces of the first trench 106a without covering the hard mask layer 104. The semiconductor material layer 120A may include a semiconductor material, such as silicon, germanium, silicon germanium, silicon carbide, or any other suitable semiconductor material, but is not limited thereto. In some embodiments, the semiconductor material layer 120A may include dopants and have a specific conductivity type. For example, the semiconductor material layer 120A may have N-type conductivity type. Since the semiconductor material layer 120A is conformal to the first trenches 106a, the portions of the semiconductor material layer 120A on the sidewalls of the first trenches 106a may substantially reproduce the first slope.

Please refer to FIG. 5. Subsequently, a second etching process E2 is performed to anisotropically etch away the portions of the semiconductor material layer 120A on the bottom surfaces of the first trenches 106a and continue to etch the exposed portions of the substrate 100, thereby forming a plurality of second trenches 106b directly under the first trenches 106a, respectively. It is noteworthy that after the second etching process E2, the sidewalls of the first trenches 106a are still fully covered by the remaining portions of the semiconductor material layer 120A and are not exposed. The remaining portions of the semiconductor material layer 120A are referred as the semiconductor layers 120 in the following description. As shown in FIG. 5, the openings of the second trenches 106b are substantially flush with the bottom ends of the semiconductor layers 120. The positions of the bottom ends of the semiconductor layer 120 are substantially determined by the depths (the bottom surfaces) of the first trenches 106a. In some embodiments of the present invention, the bottom ends of the semiconductor layers 120 are at a same depth from the surface of the substrate 100. It may be said that the bottom ends of the semiconductor layers 120 are coplanar. After the second etching process E2, a clean step (such as solvent clean, plasma clean or any other suitable clean step) may be performed on the substrate 100 to remove by-products such as polymers generated during the second etching process E2. The sidewalls of the semiconductor layers 120 may substantially reproduce the first slope.

According to some embodiments of the present invention, the second etching process E2 may be a reactive ion etching (ME) process using reactive gases such as oxygen-containing gases, fluorine-containing gases (such as $CF_4$, $SF_6$, $CH_2F_2$, $CHF_3$ and/or $C_2F_6$), chlorine-containing gases (such as $C_{12}$, $CHCl_3$, $CCl_4$ and/or $BCl_3$), bromine-containing gases (such as HBr and/or $CHBr_3$), iodine-containing gases, other suitable gases, or combinations thereof, but is not limited thereto. The second etching process E2 may use an inert gas such as argon (Ar) as a carrier gas or purge gas. The gases used in the first etching process E1 and the second etching process E2 may be the same. However, it is noteworthy that, by adjusting the process parameters (such as gas ratio and power), the second etching process E2 may generate more polymer by-products than the first etching process E1, so that more polymer by-products may deposit on the sidewalls of the trenches to provide a stronger sidewall passivation effect during the second etching process E2. The second etching process E2 may be referred as a high polymer etching process. Accordingly, the cross-sectional profiles of the second trenches 106b may be different from the cross-sectional profiles of the first trenches 106a. For example, the sidewalls of the second trenches 106b may be more inclined or tapered than the sidewalls of the first trenches 106a. The second trenches 106b may respectively have a sidewall S2 with a second slope that is different from the first slope of the sidewall S1 of the corresponding one of the first trenches 106a. When using the angle between the sidewall S2 and the surface of the substrate 100 to represent the second slope, the second slope may be between approximately 90 and 70 degrees, but is not limited thereto. The second slop is taper than the firs slop.

The second etching process E2 may have a time mode etching end point, or may be terminated automatically due to accumulation of the polymer by-products to obstruct the etching. As shown in the left side of FIG. 5, the second trench 106b between the side edges of the active regions 108 may have a width W3 (approximately at the opening) and a depth D3. As shown in the right side of FIG. 5, the second trench 106b between the terminal portions of the active regions 108 may have a width W4 (approximately at the opening) and a depth D4. Since the second trench 106b is formed self-aligned to sidewalls of the semiconductor layers 120, the width W3 of the second trench 106b is smaller than the width W1 (shown in FIG. 3) of the corresponding first trench 106a, and the width W4 of the second trench 106b is smaller than the width W2 (shown in FIG. 3) of the corresponding first trench 106a. The first trench 106a and the second trench 106b are combined together to form an isolation trench 106. The proportion of the first trench 106a and the second trench 106b with respect to the isolation trench 106 may be adjusted based on design requirements and process window, such as structural supports, electrical isolation between the active regions 108, gap filling of the dielectric layer 122 (see to FIG. 6), contacting areas and resistances of the contact plugs SNC (see FIG. 8), depths of the word lines WL (see FIG. 8), electrical isolation between the word lines WL and the active regions 108, and the parasitic electrons and parasitic capacitances caused by the word lines WL. In some embodiments of the present invention, the depth D3 is larger than the depth D1, and the depth D4 is larger than the depth D2.

Please refer to FIG. 6. Subsequently, a deposition process such as chemical vapor deposition (CVD), physical vapor deposition (PVD), atomic layer deposition (ALD), or epitaxial growth deposition may be performed to form a dielectric layer 122 on the substrate 100. In some embodiments, the dielectric layer 122 may be formed by oxidation of the substrate 100 through an oxidation process (such as thermal oxidation or in-situ steam generation oxidation). A planarization process such as chemical mechanical polishing (CMP) are performed to remove unnecessary portions of the dielectric layer 122 outside the isolation trenches 106. The remaining portions of the dielectric layer 122 filling in the isolation trenches 106 form the isolation structures 130. The pad layer 102 and the remaining hard mask layer 104 may be removed by the planarization processes or by another etching process after the planarization process. Optionally, a liner (such as a silicon oxide layer) may be formed along the sidewall and the bottom surface of each of the isolation trenches 106 before forming the dielectric layer 122. The material of the isolation structures 130 (that is, the material of the dielectric layer 122) may be silicon oxide, silicon nitride, and/or any other suitable dielectric materials.

As shown in FIG. 6, the isolation structures 130 respectively have an upper portion 130a corresponding to the first trench 106a and a lower portion 130b corresponding to the second trench 106b. The upper portion 130a of each isolation structure 130 directly contacts the semiconductor layers 120 on sidewalls of the first trench 106a, and is not in direct contact with the substrate 100 (the active regions 108) by being separated by the semiconductor layers 120. In some embodiments, the sidewall of the upper portion 130a may substantially have the first slope.

The lower portion 130b of each isolation structure 130 directly contacts the substrate 100. The boundary between the upper portion 130a and the lower portion 130b is approximately flush with the bottom ends of the semiconductor layers 120 at two sides of the upper portion 130a. In some embodiments, the lower portions 130b may have a trapezoidal or tapered cross-sectional profile, and the slope of the sidewall of the lower portions 130b may be substantially equal to the second slope of the sidewall S2 of the second trench 106b.

The thickness TO of each isolation structure 130 is substantially equal to the sum of the thicknesses of the upper portion 130a and the lower portion 130b. As shown in the left side of FIG. 6, the isolation structure 130 between side edges of the active regions 108 may have an upper portion 130a having a thickness T1 and a lower portion 130b having a thickness T3. As shown in the right side of FIG. 6, the isolation structure 130 between terminal portions of the active regions 108 may have an upper portion 130a having a thickness T2 and a lower portion 130b having a thickness T4. In some embodiments of the present invention, the thickness T3 is larger than the thickness T1, and the thickness T4 is larger than the thickness T2. That is, in the overall thickness of the isolation structure 130, the proportion of the lower portion 130b is larger than the proportion of the upper portion 130a.

Figure 8:
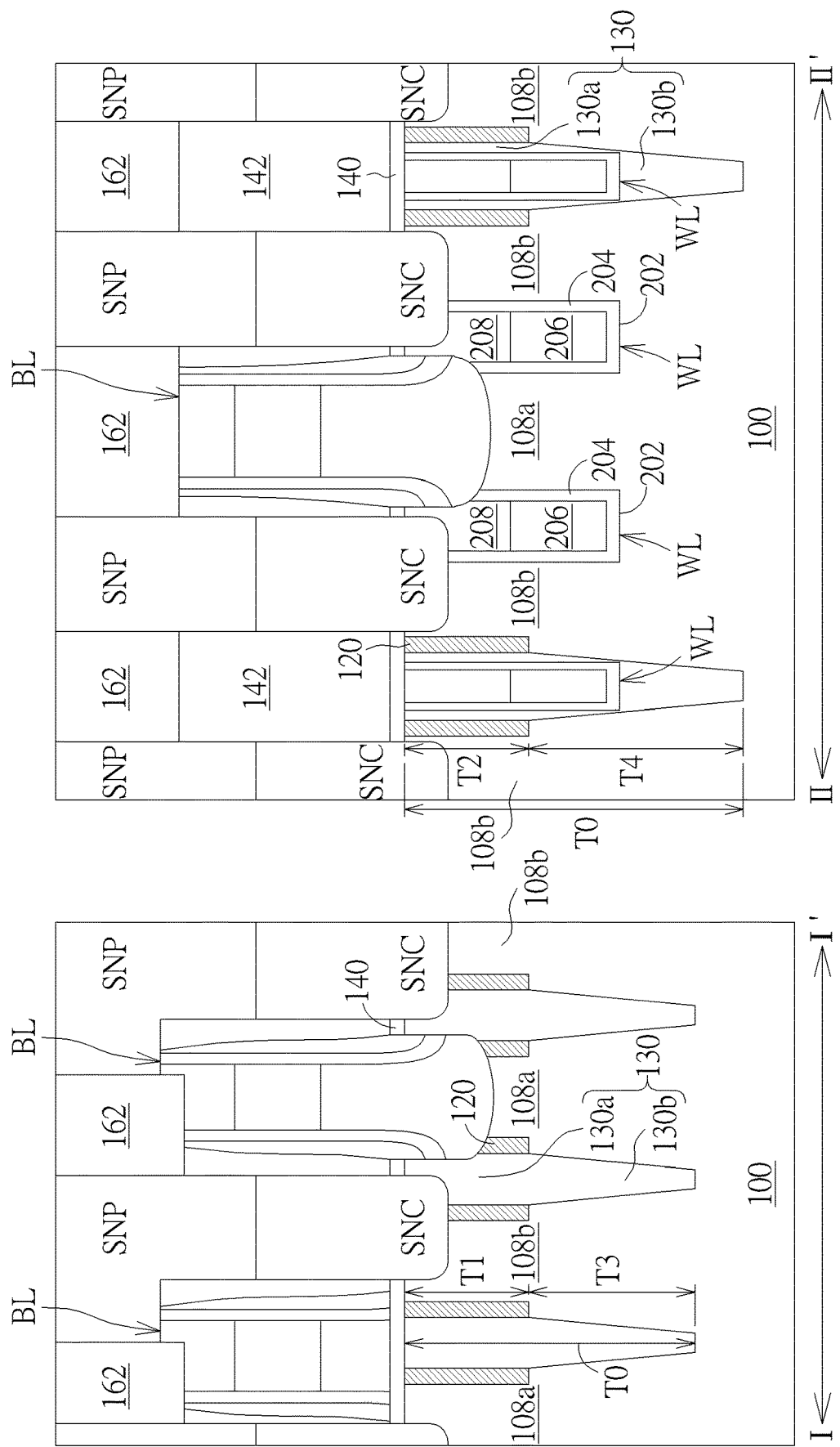

Please refer to FIG. 7 and FIG. 8. Following, an insulating layer 140 such as a silicon oxide layer may be formed on the substrate 100, and successive manufacturing processes are performed to form a plurality of word lines WL, a plurality of bit lines BL, a plurality of contact plugs SNC, and a plurality of contact pads SNP respectively on the contact plugs SNC. As shown in FIG. 7 and FIG. 8, the word lines WL are formed in the word line trenches 202 in the substrate 100, respectively elongate along the second direction DR2 and are arranged in parallel along the third direction DR3. The word lines WL cut through the isolation structures 130 and the active regions 108 to divide each active region 108 into a center portion 108a and two terminal portions 108b. Each word line WL includes a conductive layer 206 disposed in a lower portion of the word line trench 202, an insulating capping layer 208 disposed on the conductive layer 206 and filling the remaining spaces of the word line trench 202, and a dielectric layer 204 intervening between the conductive layer 206 and the substrate 100. The conductive layer 206 may include a metal material, such as tungsten (W), copper (Cu), aluminum (Al), titanium (Ti), tantalum (Ta), a work function metal, a compound, alloy or composite layer of the above metal materials, but is not limited thereto. The insulating capping layer 208 and the dielectric layer 204 may respectively include a dielectric material such as silicon oxide, silicon nitride, silicon oxynitride, silicon carbide nitride, high-k dielectric material, or a combination thereof, but is not limited thereto. In some embodiments, as shown in the right side of FIG. 8, the top surfaces of the insulating capping layers 208 of the word lines WL, the top surfaces of the isolation structures 130, the top ends of the semiconductor layers 120, and/or the surface of the substrate 100 which contacts the insulating layer 140 may be substantially flush with each other. The bottom surfaces of the insulating capping layers 208 (or the top surfaces of the conductive layers 206) are higher than the bottom ends of the semiconductor layers 120.

The bit lines BL are disposed on the substrate 100, respectively elongate along the third direction D3 and are arranged in parallel along the second direction DR2. The portions of the bit lines BL overlapping the center portions 108a of the active regions 108 are in direct contact with the center portions 108a and the semiconductor layers 120 at two sides the center portions 108a. Other portions of the active regions 108 are electrically isolated from the bit lines BL by the insulating layer 140. The bit lines BL respectively have a stacked structure, including a semiconductor layer, a metal layer on the semiconductor layer, and a hard mask layer on the metal layer. The semiconductor layer of each bit line BL may include poly silicon, amorphous silicon, non-crystalline silicon, or other suitable semiconductor materials. The metal layer of each bit line BL may include aluminum, tungsten, copper, titanium aluminum alloy, or other suitable low resistance metal materials. The hard mask layer of each bit line BL may include a dielectric material such as silicon oxide, silicon nitride, silicon oxynitride, silicon carbide nitride, or a combination thereof, but is not limited thereto. In some embodiments, an interface layer (not shown) may be provided between the semiconductor layer and the metal layer of each bit line BL. The interfacial layer may include a single layer or multiple layers made of titanium, tungsten silicide, tungsten nitride, and/or other metal silicides or metal nitrides, but is not limited thereto. The bottom surfaces of the bit lines BL may be recessed into the substrate 100 to be lower than the top surfaces of the isolation structures 130 and higher than the bottom ends of the semiconductor layers 120.

The contact plugs SNC are disposed on the substrate 100 and between the bit lines BL, penetrate through the interlayer dielectric layer 142 between the bit lines BL and respectively directly contact the terminal portions 108b of the active regions 108 and the semiconductor layers 120 on the sidewalls of the terminal portions 108b. Spacers may be provided on sidewalls of the bit lines BL to electrically isolate the bit lines BL and the contact plugs SNC. The contact plugs SNC may include a conductive material, such as a semiconductor material, a metal material, or a combination thereof. The semiconductor material for the contact plugs SNC may include poly silicon, amorphous silicon, non-crystalline silicon, or other suitable semiconductor materials. The metal material for the contact plugs SNC may include tungsten (W), copper (Cu), aluminum (Al), titanium (Ti), tantalum (Ta), a compound, alloy or composite layer of the above metal materials, but is not limited thereto. In some embodiments, a semiconductor material and a metal material may be employed in different parts of each of the contact plugs SNC. The materials of the interlayer dielectric layer 142 and the spacers on sidewalls of the bit lines BL may include silicon oxide, silicon nitride, silicon oxynitride, silicon carbide nitride, high-k dielectric materials, or a combination thereof. The bottom surfaces of the contact plugs SNC may be recessed into the substrate 100 to be lower than the top surfaces of the isolation structures 130 and higher than the bottom surfaces of the bit lines BL. The top ends of the semiconductor layers 120 in contact with the bit lines BL or the contact plugs SNC are recessed to different depths in the substrate 100 and lower than the top ends of other semiconductor layers 120 which are not in direct contact with the bit lines BL and the contact plugs SNC, since the bottom surfaces of the bit lines BL and the contact plugs SNC are recessed to different depths in the substrate 100. It may be said that the top ends of the semiconductor layers 120 are not on the same plane.

The contact pads SNP are directly disposed on the contact plugs SNC and respectively include a lower portion between the sidewalls of the bit lines BL and an upper portion protruding from the bit lines BL and partially overlapping the top surfaces of the bit lines BL. The contact pads SNP may include a metal material, such as tungsten (W), copper (Cu), aluminum (Al), titanium (Ti), tantalum (Ta), a work function metal, a compound, alloy or composite layer of the above metal materials, but is not limited thereto. The spaces between the upper portions of the contact pads SNP are filled with a passivation layer 162 to provide a flat surface topography before subsequent manufacturing processes to fabricate the capacitors (not shown) of the memory cells. The passivation layer 162 may be made of silicon nitride, but is not limited thereto.

At the present stage as shown in FIG. 8, the semiconductor device according to one embodiment of the present invention is completed. It is one feature of the present invention that the isolation trenches 106 (see FIG. 5) where the isolation structures 130 are formed are etched by a two-stage etching process (including the first etching process E1 and the second etching process E2), so that each of the isolation trenches 106 has a two-stage sidewall having different slops. More specifically, the upper portions of the sidewalls of the isolation trenches 106 have a more vertical profile, allowing a more accurate control to the critical dimensions of the active region 108. The lower portions of the sidewalls of the isolation trenches 106 have a more taper profile, allowing a better gap filling of the dielectric layer 122 to fill the isolation trenches 106. In this way, it may be ensured that no voids or seams may be formed in the portions of the isolation structures 130 where the word lines WL pass, which otherwise may cause serious leakage and device failure. Overall, the quality of the isolation structures 130 provided by the present is improved. In some embodiments, the isolation trenches 106 may be completely filled by the dielectric layer 122 to form void-less or seam-less isolation structures 130.

Figure 9:
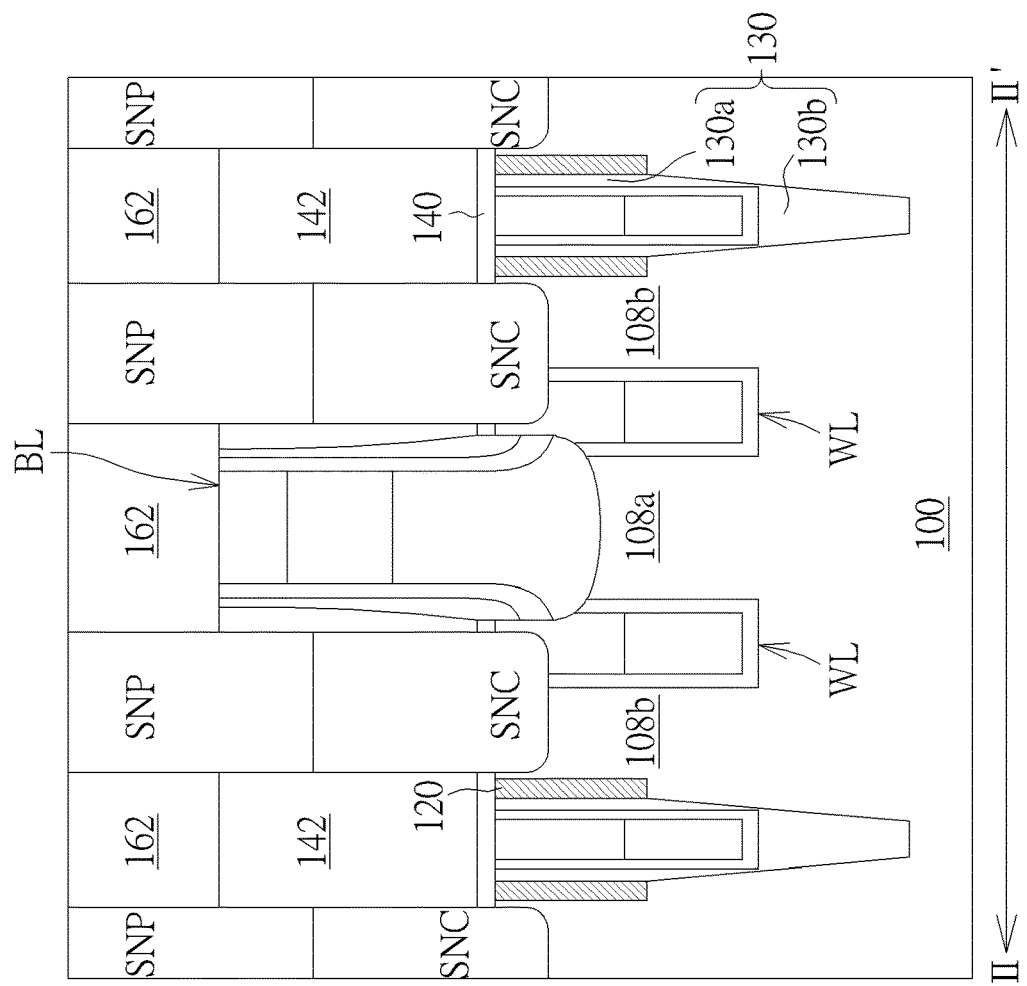
FIG. 9 is schematic diagram illustrating a cross-sectional view of a semiconductor device according to another embodiment of the present invention.
Figure 9:
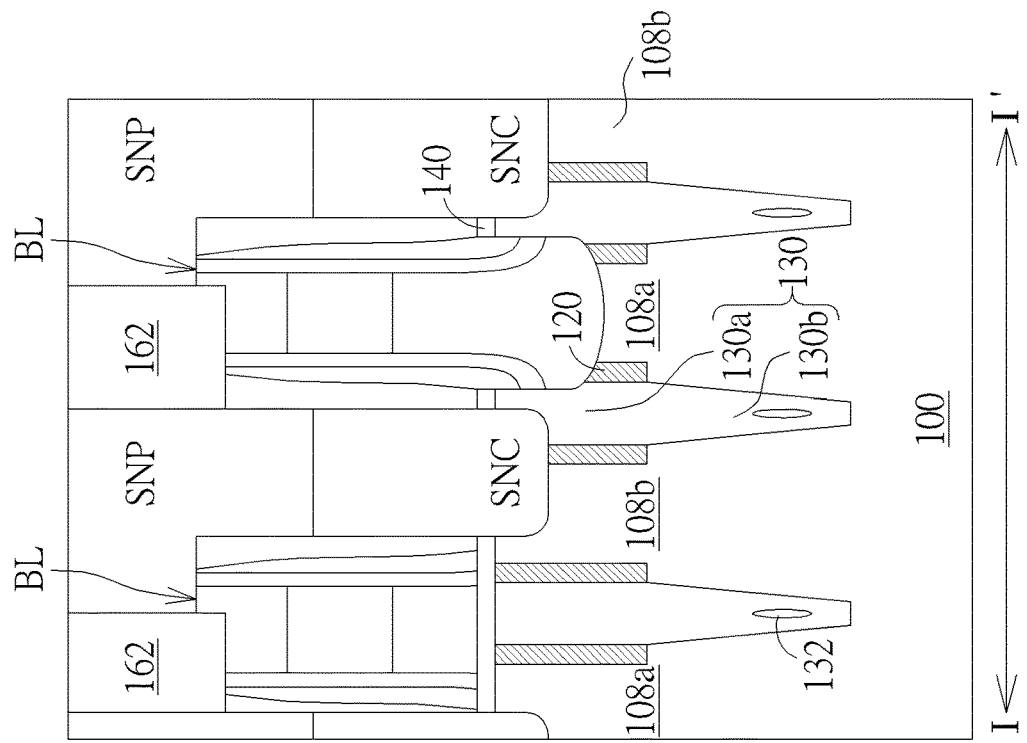
Figure 10:
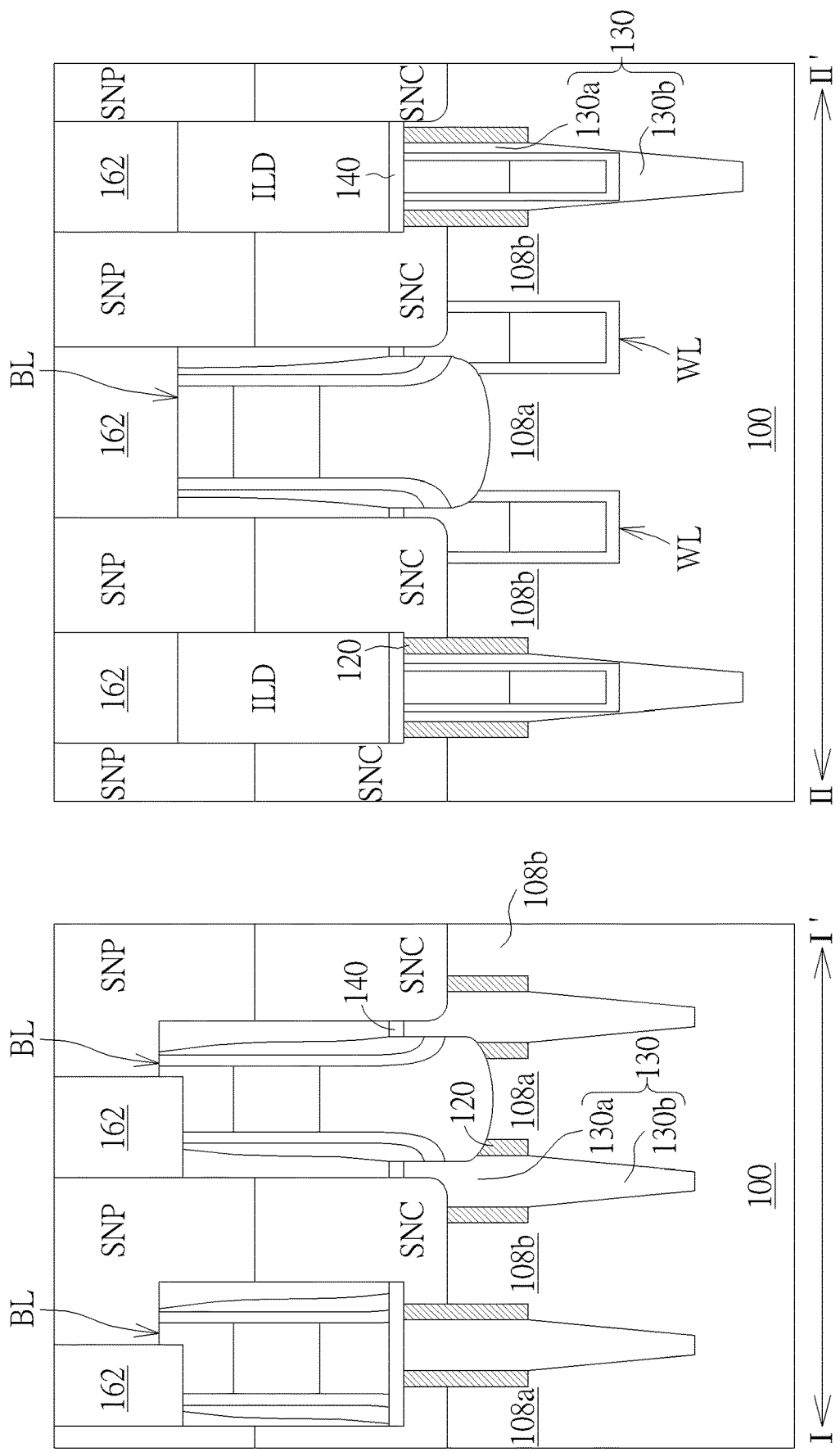
FIG. 10 is schematic diagram illustrating a cross-sectional view of a semiconductor device according to still another embodiment of the present invention.

Please refer to FIG. 9 and FIG. 10, which are schematic diagrams illustrating cross-sectional views of the semiconductor devices according to other embodiments of the present invention. Like the semiconductor device shown in FIG. 8, the semiconductor devices shown in FIG. 9 and FIG. 10 respectively include a substrate 100, a plurality of active regions 108 (annotated as the middle portions 108a and the terminal portions 108b), a plurality of isolation structures 130, and a plurality of semiconductor layers 120 disposed between the upper portions 130a of the isolation structure 130 and the active regions 108. The difference is that, as shown in FIG. 9, when the depths of the second trenches 106b are deeper, voids 132 may be formed near the bottom portions of the second trenches 106b. By controlling the second slop of the sidewalls of the second trenches 106b, the voids 132 may be controlled to be lower than the predetermined depths of the word lines WL to avoid defects due to exposure of the voids 132 when etching the word line trenches 202. As shown in FIG. 10, larger portions of the terminal portions 108b of the active regions 108 may be removed when forming the contact holes (not shown) of the contact plugs SNC until exposing the semiconductor layers 120 on sidewalls of the terminal portions 108b Accordingly, the semiconductor layers 120 on sidewalls of the terminal portions 108b may be in direct contact with the contact plugs SNC. In this way, the contact resistance may be reduced to achieve a further improved device performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a plurality of active regions disposed in the substrate, respectively extending along a first direction and arranged into an array;
   a plurality of isolation structures disposed in the substrate between the active regions and respectively comprising an upper portion having a first thickness and a lower portion having a second thickness, wherein a sidewall of the upper portion comprises a first slope, a sidewall of the lower portion comprises a second slop, and the first slope and the second slope are different; and
   a plurality of semiconductor layers disposed between the upper portions of the isolation structures and the active regions.

2. The semiconductor device according to claim 1, wherein the substrate comprises silicon, the semiconductor layers comprises silicon, germanium, or silicon germanium.

3. The semiconductor device according to claim 1, wherein bottom ends of the semiconductor layers are flush with boundaries between the upper portions and the lower portions of the isolation structures.

4. The semiconductor device according to claim 1, wherein the second thickness is larger than the first thickness.

5. The semiconductor device according to claim 1, wherein top ends of the semiconductor layers are not coplanar.

6. The semiconductor device according to claim 1, further comprising voids formed in the lower portions of the isolation structures.

7. The semiconductor device according to claim 1, further comprising:
   a plurality of word lines disposed in the substrate, extending parallel along a second direction and cutting through the isolation structures and the active regions to divide each of the active regions into a center portion and two terminal portions;
   a plurality of bit lines disposed on the substrate, extending parallel along a third direction and directly contacting the center portions of the active regions and the semiconductor layers at two sides of the center portions, wherein the first direction, the second direction, and the third direction are different directions, and the second direction and the third direction are perpendicular; and
   a plurality of contact plugs disposed on the substrate and between the bit lines and directly contacting the terminal portions of the active regions.

8. The semiconductor device according to claim 7, wherein the contact plugs are in direct contact with the semiconductor layers at one side of each of the terminal portions.

9. The semiconductor device according to claim 7, wherein bottom ends of the isolation structures between the terminal portions are lower than bottom ends of the isolation structures at two sides of the center portions.

10. The semiconductor device according to claim 7, wherein bottom ends of the semiconductor layers are lower than bottom surfaces of the contact plugs.

11. The semiconductor device according to claim 7, wherein the word lines respectively comprise:
    a conductive layer; and
    an insulating capping layer disposed on the conductive layer, wherein top ends of the semiconductor layers are flush with top surfaces of the insulating capping layers, and bottom ends of the semiconductor layers are lower than bottom surfaces of the insulating capping layers.

* * * * *